(12) United States Patent
Chen

(10) Patent No.: US 11,495,620 B2
(45) Date of Patent: Nov. 8, 2022

(54) DISPLAY PANEL, FABRICATION METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Cheng Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 182 days.

(21) Appl. No.: 16/638,767

(22) PCT Filed: Dec. 18, 2019

(86) PCT No.: PCT/CN2019/126133
§ 371 (c)(1),
(2) Date: Feb. 13, 2020

(87) PCT Pub. No.: WO2021/103204
PCT Pub. Date: Jun. 3, 2021

(65) Prior Publication Data
US 2021/0159251 A1    May 27, 2021

(51) Int. Cl.
*H01L 27/12* (2006.01)

(52) U.S. Cl.
CPC ........ *H01L 27/1218* (2013.01); *H01L 27/124* (2013.01); *H01L 27/1248* (2013.01); *H01L 27/1259* (2013.01)

(58) Field of Classification Search
CPC ............... H01L 27/124; H01L 27/1248; H01L 27/3258; H01L 27/3276; H01L 27/3279
See application file for complete search history.

(56) References Cited

U.S. PATENT DOCUMENTS

| 8,173,494 B2 | 5/2012 | Choung et al. | |
| 2019/0259967 A1* | 8/2019 | Yang | G06F 1/1652 |
| 2021/0408190 A1* | 12/2021 | Yang | H01L 27/3262 |

FOREIGN PATENT DOCUMENTS

| CN | 107564941 A | * | 1/2018 | ............ H01L 27/32 |
| CN | 108288631 A | | 7/2018 | |
| CN | 109300848 A | | 2/2019 | |
| CN | 109659339 A | | 4/2019 | |
| CN | 109742121 A | | 5/2019 | |
| CN | 110265409 A | | 9/2019 | |
| CN | 110429116 A | * | 11/2019 | ............ H01L 51/56 |

* cited by examiner

*Primary Examiner* — Peter M Albrecht
(74) *Attorney, Agent, or Firm* — Mark M. Friedman

(57) ABSTRACT

A display panel, a fabrication method thereof, and a display device are provided. The display panel is divided into a display area, a line switching area, and a bending area in a horizontal direction and includes a substrate, a barrier layer, a buffer layer, an active layer, a first gate insulating layer, a first metal layer, and a second gate insulating layer sequentially formed from bottom to top. The display panel further includes a first through hole, a second metal layer, a first organic layer, a second metal layer, an interlayer insulating layer, and a third metal layer, wherein a portion of the third metal layer penetrates the interlayer insulating layer and is electrically connected to the second metal layer.

7 Claims, 2 Drawing Sheets

DISPLAY PANEL, FABRICATION METHOD THEREOF, AND DISPLAY DEVICE

The present application claims priority to Chinese Patent Application No. 201911169679.6, titled "Display Panel, Fabrication Method Thereof, and Display Device", filed on Nov. 26, 2019 with the China National Intellectual Property Administration, which is incorporated by reference in the present application in its entirety.

FIELD OF INVENTION

The present invention relates to the field of display technologies, and more particularly, to a display panel, a fabrication method thereof, and a display device.

BACKGROUND

Organic light-emitting diodes (OLEDs) have been widely used in various applications due to their lightweight, self-luminescence, wide viewing angles, low driving voltage, high emission efficiency, low power consumption, and fast response times. Especially, flexible OLED display devices have become a main focus of research and development in the field of display technologies due to their properties such as bendability and easy portability.

Presently, high-end mobile phones require higher brightness uniformity. How to improve the brightness uniformity of a screen is a key future direction for major manufacturers.

SUMMARY

The object of the present invention is to solve the technical problem that existing display panels cannot meet higher brightness uniformity requirements.

In order to achieve the above object, the present invention provides a display panel, wherein the display panel is divided into a display area, a line switching area, and a bending area in a horizontal direction, and comprises a substrate, a barrier layer, a buffer layer, an active layer, a first gate insulating layer, a first metal layer, and a second gate insulating layer sequentially formed from bottom to top. The display panel further comprises a first through hole, sequentially penetrating the barrier layer, the buffer layer, the first gate insulating layer, and the second gate insulating layer in the bending area to function as a source-drain connecting opening; a second metal layer, partially disposing on a bottom and an inner sidewall of the first through hole and extending to a surface of the second gate insulating layer; a first organic layer, disposing on a surface of the second gate insulating layer away from the first gate insulating layer and in the first through hole, wherein the second metal layer is partially disposed on a surface of the first organic layer away from a surface on one side of the second gate insulating layer; an interlayer insulating layer, disposing on a surface of the first organic layer away from the second gate insulating layer; and a third metal layer, disposing on a surface of the interlayer insulating layer away from the first organic layer, wherein a portion of the third metal layer located in the display area penetrates the interlayer insulating layer and is electrically connected to the second metal layer.

Furthermore, the first metal layer comprises aluminum or an aluminum alloy; and/or the second metal layer comprises aluminum or aluminum alloy.

Furthermore, the display panel further comprises a second through hole, penetrating the first organic layer in the display area, wherein the second through hole is partially connected to the first through hole to function as a source-drain connecting opening, and another portion of the second through hole is corresponding disposed with electrode patterns under a capacitor of the metal layer driving circuit to form a capacitor opening, wherein the second metal layer is partially disposed in the second through hole, and is disposed on a surface of the second gate insulating layer away from the first gate insulating layer.

Furthermore, the display panel further comprises a third through hole penetrating the interlayer insulating layer, the first organic layer, the second gate insulating layer, and the first gate insulating layer; and/or a third through hole penetrating the interlayer insulating layer and the first organic layer; and/or a third through hole penetrating the interlayer insulating layer.

Furthermore, the third metal layer is partially disposed in the third through hole.

Furthermore, the third metal layer is partially overlapped to a grid trace of the second metal layer through the third through hole to form a parallelly-connected circuit.

In order to achieve the above objects, the present invention provides a display device, comprising the display panel describe above.

In order to achieve the above objects, the present invention provides a fabrication method of a display panel, comprising a substrate providing step, a barrier layer fabrication step, a buffer layer fabrication step, an active layer fabrication step, a first gate insulating layer fabrication step, a first metal layer fabrication step, and a second gate insulating layer fabrication step. The fabrication method further comprises a first through hole setting step penetrating the barrier layer, the buffer layer, the first gate insulating layer, and the second gate insulating layer to form a first through hole; a first organic layer fabrication step fabricating the first organic layer on an upper surface of the second gate insulating layer and in the first through hole; a second metal layer fabrication step exposing the first organic layer and forming the second metal layer on a bottom and inner side walls of the first through hole, and on the upper surface of the second gate insulating layer, and forming a second metal layer on an upper surface of the first organic layer; an interlayer insulating layer fabrication step fabricating the interlayer insulating layer on the upper surfaces of the first organic layer and the second metal layer; and a third metal layer fabrication step, fabricating the third metal layer on an upper surface of the interlayer insulating layer.

Furthermore, after the first organic layer fabrication step, the method further comprises a second through-hole setting step setting the second through-hole at a first organic layer above the first metal layer, wherein in the second metal layer fabrication step, a portion of the second metal layer is disposed in the second through hole and is disposed corresponding to the first metal layer.

Furthermore, after the step of fabricating the interlayer insulating layer, the method further comprises a fourth through-hole setting step, providing the fourth through-hole on the interlayer insulating layer so that the fourth through-hole penetrates through the interlayer insulating layer and is disposed corresponding to the first through-hole; and a second organic layer fabrication step, fabricating a second organic layer in the fourth through hole. In the third metal layer preparation step, the third metal layer is partially disposed on an upper surface of the second organic layer.

The technical effect of the present invention is using a metal layer made of aluminum or aluminum alloy to improve a conductivity and bendability of a metal wiring. A data signal line in a bending area is directly disposed on an upper surface of a substrate so that the data signal line is closer to a neutral plane, and the risk of fracture when the data signal line is bent is reduced. A metal layer structure with a grid shape is utilized to form a structure bridged by source and drain electrodes with a gate layer to provide a double-layer power signal, which can reduce resistance of the metal wiring, thereby reducing a voltage drop of a display panel and improving brightness uniformity of the display panel.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
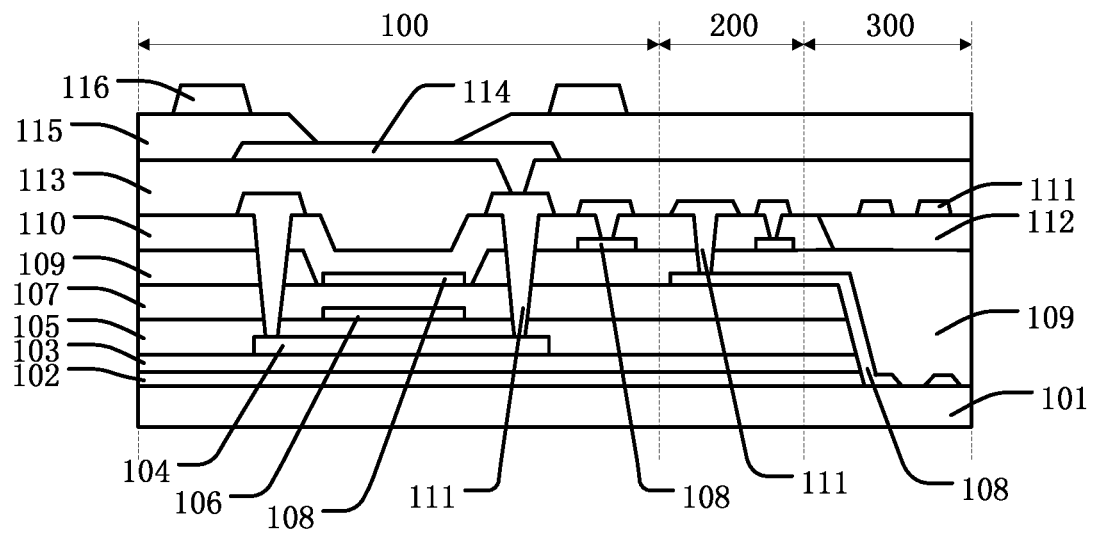
FIG. 1 is a cross-sectional view of a display panel according to an embodiment of the present invention.

Please refer to the drawings, in which the same reference numerals represent the same components. The following description is based on specific embodiments of the present invention as illustrated and should not be construed as limiting the specific embodiments that are not described herein.

In the description of the present invention, it should be understood that the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. or the positional relationship is based on the orientation or positional relationship shown in the drawings, only for the convenience of describing the present invention and simplifying the description, rather than indicating or implying that the device or element referred to must have a specific orientation, structure and operation in a specific orientation, Therefore, it cannot be understood as a limitation to the present invention. In addition, the terms "first" and "second" are used for descriptive purposes only and cannot be understood as indicating or implying relative importance or implicitly indicating the number of technical features indicated. Therefore, the features defined as "first" and "second" may explicitly or implicitly include one or more of the features. In the description of the present invention, the meaning of plurality is two or more, unless specifically defined otherwise.

The present invention provides a touch panel and a display device thereof. Dummy patterns are designed in a non-functional area of a first metal layer to solve technical problems such as a touch function of a touch panel being affected by a phenomenon of uneven etching resulting from a large difference in etching rates to the first metal layer and a second metal layer during an etching process of an existing touch panel after a photo-exposure process, as well as reduction of a production yield of the touch panel.

In the description of this application, it should be noted that the terms "installation", "connected", and "connected" should be understood in a broad sense unless explicitly stated and limited otherwise. For example, they may be fixed connections or removable. Connected or integrated; it can be mechanical, electrical, or can communicate with each other; it can be directly connected, or it can be indirectly connected through an intermediate medium, it can be the internal communication of two elements or the interaction of two elements relationship. For those of ordinary skill in the art, the specific meanings of the above terms in this application can be understood according to specific situations.

In this application, unless stated and defined otherwise, the first feature "above" or "below" the second feature may comprise direct contact between the first and second features, and may also comprise the first and second features. The features are not in direct contact but are contacted by another feature between them. Moreover, the first feature is "above" "above" "above" the second feature, and comprises that the first feature is directly above and obliquely above the second feature, or merely indicates that the first feature has a higher level than the second feature. The first feature is "below", "below", and "below" of the second feature, and comprises that the first feature is directly below and obliquely below the second feature, or only indicates that the first feature has a lower level than the second feature.

The following disclosure provides many different implementations or examples for implementing different structures of the present application. To simplify the disclosure of this application, the components and settings of specific examples are described below. Of course, they are merely examples and are not intended to limit the application. This application may repeat reference numerals and/or reference letters in different examples, and such repetition is for simplicity and clarity, and does not itself indicate a relationship between the various embodiments and/or settings discussed. In addition, examples of various specific processes and materials are provided in this application, but those of ordinary skill in the art may be aware of the application of other processes and/or the use of other materials.

Specifically, the present embodiment provides a display device comprising a display panel as shown in FIG. 1. The display panel is divided into a display area 100, a line switching area 200, and a bending area 300 in a horizontal direction. In a vertical direction, a substrate 101, a barrier layer 102, a buffer layer 103, an active layer 104, a first gate insulating layer 105, a first metal layer 106, and a second gate insulating layer 107 are sequentially formed from bottom to top. It further comprises a second metal layer 108, a first organic layer 109, an interlayer insulating layer 110, a third metal layer 111, a second organic layer 112, a planarization layer 113, an anode layer 114, a pixel defining layer 115, and a spacer 116.

The substrate 101 is a flexible substrate and has a function of blocking moisture and oxygen. The substrate 101 can have better impact resistance and can effectively protect the display panel. A material of the substrate 101 comprises one or more of glass, silicon dioxide, polyethylene, polypropylene, polystyrene, polylactic acid, polyethylene terephthalate, polyimide, or polyurethane.

The barrier layer 102 is disposed on an upper surface of the substrate 101 to block moisture and oxygen.

The buffer layer 103 is disposed on the upper surface of the barrier layer 102. The buffer layer 103 functions as a buffer. A material of the buffer layer 103 is silicon dioxide ($SiO_2$) or silicon nitride (SiNx), which may be a single $SiO_2$ film layer or a multilayer stack of silicon dioxide ($SiO_2$) and silicon nitride (SiNx) and the silicon dioxide $SiO_2$ film layer is disposed as a top layer.

The active layer 104 is provided on the upper surface of the buffer layer 103. The material of the active layer 104 is an oxide semiconductor, such as indium gallium zinc oxide (IGZO), and a thickness thereof is 300 A to 500 A (Angstroms). In the present embodiment, the thickness of the active layer 104 is preferably 400 A (Angstroms).

The first gate insulating layer 105 is disposed on upper surfaces of the active layer 104 and the buffer layer 103. The first gate insulating layer 105 functions as an insulator to prevent short circuiting inside a thin film transistor. The first gate insulating layer 105 can be a single-layer silicon dioxide ($SiO_2$) film layer or a multilayer stack of silicon dioxide ($SiO_2$) and silicon nitride SiNx, and the silicon dioxide ($SiO_2$) film layer is disposed on the bottom layer.

The first metal layer 106 is disposed on an upper surface of the first gate insulating layer 105 and is opposite to the active layer 104. The first metal layer 106 is a first gate layer, and an active layer disposed directly below the first metal layer 106 retains semiconductor characteristics. A material of the first metal layer 106 is metal. In this embodiment, aluminum or an aluminum alloy is preferred. The aluminum or aluminum alloy improves the electrical conductivity of the first metal layer 106 and bending characteristics thereof so that risk of fracture when bending the first metal layer 106 is reduced.

The second gate insulating layer 107 is disposed on upper surfaces of the first gate insulating layer 105 and the first metal layer 106. The second gate insulating layer 107 functions as an insulator to prevent short circuiting inside the thin film transistor. The second gate insulating layer 107 may be a single-layer silicon dioxide ($SiO_2$) film layer or a multilayer stack of silicon dioxide ($SiO_2$) and silicon nitride SiNx, and the silicon dioxide ($SiO_2$) film layer is disposed on the bottom layer.

The first through hole 121 sequentially penetrates the barrier layer 102, the buffer layer 103, the first gate insulating layer 105, and the second gate insulating layer 107 in the bending region 300 to serve as a source-drain connecting opening.

The second metal layer 108 is disposed on a bottom of the first through hole 121 and an inner sidewall thereof and extends to an upper surface of the second gate insulating layer 107. A material of the second metal layer 108 is metal. In this embodiment, aluminum or an aluminum alloy is preferred. The aluminum or aluminum alloy improves the electrical conductivity of the second metal layer 108 and its bending characteristic and reduces risk of fracture when the second metal layer 108 is bent. The second metal layer 108 is used for transferring data signals.

The second metal layer 108 is a grid-like structure. Since FIG. 1 is a cross-sectional view of the display panel, the second metal layer 108 in FIG. 1 is shown as a disconnected structure, but it is, in fact, a connected structure. The second metal layer 108 is disposed at the bottom of the first through hole 121 and is closer to the neutral plane. Therefore, the second metal layer 108 is not easy to break when it is bent.

The first organic layer 109 is disposed on the upper surface of the second gate insulating layer 107 and in the first through hole 121. The first organic layer 109 is an organic insulating layer, which functions as an insulator and prevents short-circuiting of the metal layers.

The second through hole 122 sequentially penetrates the first organic layer 109 of the display area 100, the second through hole 122 is partially connected to the first through hole 121 and functions as a source-drain connecting opening, and the other part thereof is opposite to a lower electrode pattern of a capacitor of the driving circuit of the first metal layer 106 to form a capacitor opening.

The second metal layer 108 is disposed in the second through hole 122 and on the upper surface of the second gate insulating layer 107 and is opposite to the first metal layer 106. The second metal layer 108 is a second gate electrode layer, and a material of the second metal layer 108 is metal. In the present embodiment, aluminum or an aluminum alloy is preferred. The aluminum or the aluminum alloy improves the electrical conductivity of the second metal layer 110 and bending characteristic thereof, thereby reducing the risk of fracture of when the second metal layer 108 is bent.

The interlayer insulating layer 110 is disposed on the upper surfaces of the second metal layer 108 and the first organic layer 109. The interlayer insulating layer 110 is disposed with two or more third through holes 117, and the third through holes 117 penetrates the interlayer insulating layer 110, and/or, the third through hole 117 penetrates the interlayer insulating layer 110 and the first organic layer 109, and/or, and the second gate insulating layer 107 and the first gate insulating layer 105 provide a channel for the subsequent third metal layer 111.

The third metal layer 111 is disposed on the upper surface of the interlayer insulating layer 110 and is disposed in the third through hole 117, partially electrically connecting to the active layer 104 as a source and drain layer, thereby forming an electrical connection between the third metal layer 111 and the active layer 104.

Figure 2:
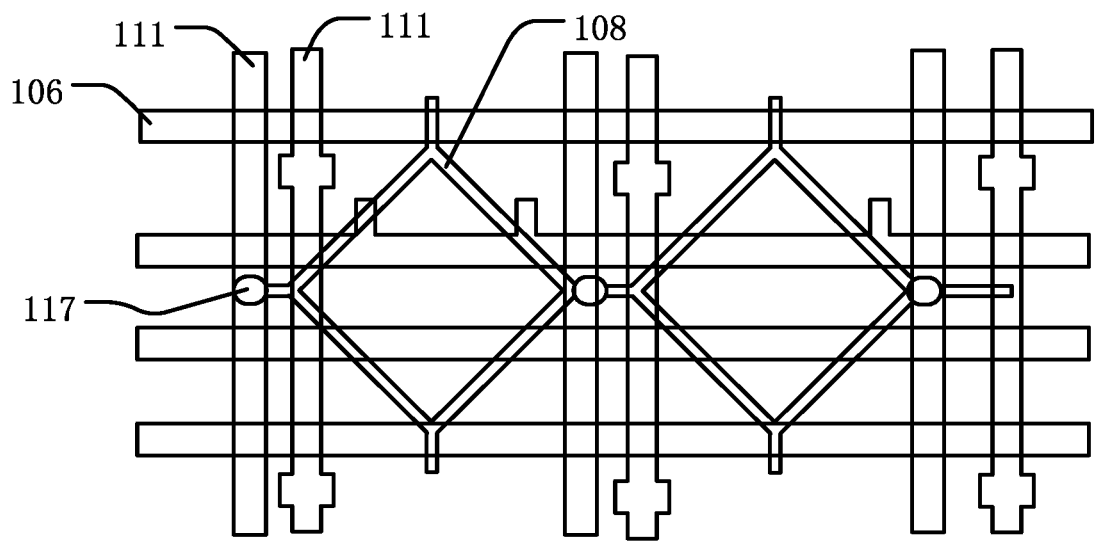
FIG. 2 is a top view of the display panel according to an embodiment of the present invention.

The third metal layer 111 in the display area 100 is disposed in the third through hole 117 to electrically connect to the second metal layer 108. The second metal layer 108 is formed with a grid structure. Refer to the top view of FIG. 2. The metal layer of the grid structure has smaller resistance, so the voltage drop in the circuit can be further reduced.

The third metal layer 111 in the line switching area 200 is disposed in the third through hole 117 to electrically connect to the second metal layer 108 and extends to the second metal layer 108 in the bending area 300 for transferring data signals. The third metal layer 111 in the line switching area 200 is disposed in the third through hole to electrically connect to the second metal layer 108 and is directly changed to the second metal layer 108 in the bending area 300 for transferring data signals. Therefore, all data signals in the bending area 300 are transferred by the second metal layer 108, and the second metal layers 108 are disposed at the bottom of the first through hole 121, which is closer to the neutral plane. Therefore, the second metal layer 108 is not easily broken when it is bent.

The planarization layer 113 is disposed on upper surfaces of the third metal layer 111 and the interlayer insulating layer 110. The planarization layer 113 functions as a passivation for the lower film layers. The planarization layer 113 is provided with a fourth through hole 123, which is opposite to the first through hole 121. The fourth through hole 123 penetrates the planarization layer 113 and provides a channel for subsequent film layers.

The second organic layer 112 is disposed in the interlayer insulating layer 110, and the second organic layer 112 is an organic insulating layer, which functions as an insulator and prevents short circuiting of the metal layers.

The anode layer 114 is disposed on the upper surface of the planarization layer 113 and is opposite to the third metal layer 111. The anode layer 114 penetrates the planarization layer 113 and is electrically connected to the third metal layer 111. An electrical signal can be obtained from the thin film transistor to provide an electrical signal to a light-emitting layer for emitting light.

The fifth metal layer (not shown) may be disposed on the third metal layer 111 or the anode layer 114 to provide an initialization voltage signal for the display panel. The fifth metal layer (not shown) and the third metal layer 111 form a double-layer voltage wiring, which can reduce the resistance and further reduce the voltage drop, thereby improving brightness uniformity of the display panel.

The pixel definition layer 115 is disposed on upper surfaces of the planarization layer 113 and the anode layer 114 and is used to define a size of the light-emitting layer. The pixel definition layer 115 is disposed with through holes of the pixel definition layer. The through holes of the pixel definition layer penetrate the pixel definition layer 115 and are disposed opposite to the anode layer 114 to provide a channel for the subsequent light-emitting layer.

The spacer 116 is disposed on the upper surface of the pixel definition layer 115 to support subsequent film layers, prevent the problem of collapsing and deformation, and ensure the yield of the display panel.

The technical effect of the display panel of the present embodiment is using a metal layer made of aluminum or aluminum alloy to improve a conductivity and bendability of a metal wiring. A data signal line in a bending area is directly disposed on an upper surface of a substrate so that the data signal line is closer to a neutral plane, and the risk of fracture when the data signal line is bent is reduced. A metal layer structure with a grid shape is utilized to form a structure bridged by source and drain electrodes with a gate layer to provide a double-layer power signal, which can reduce resistance of the metal wiring, thereby reducing a voltage drop of a display panel and improving brightness uniformity of the display panel.

Figure 3:
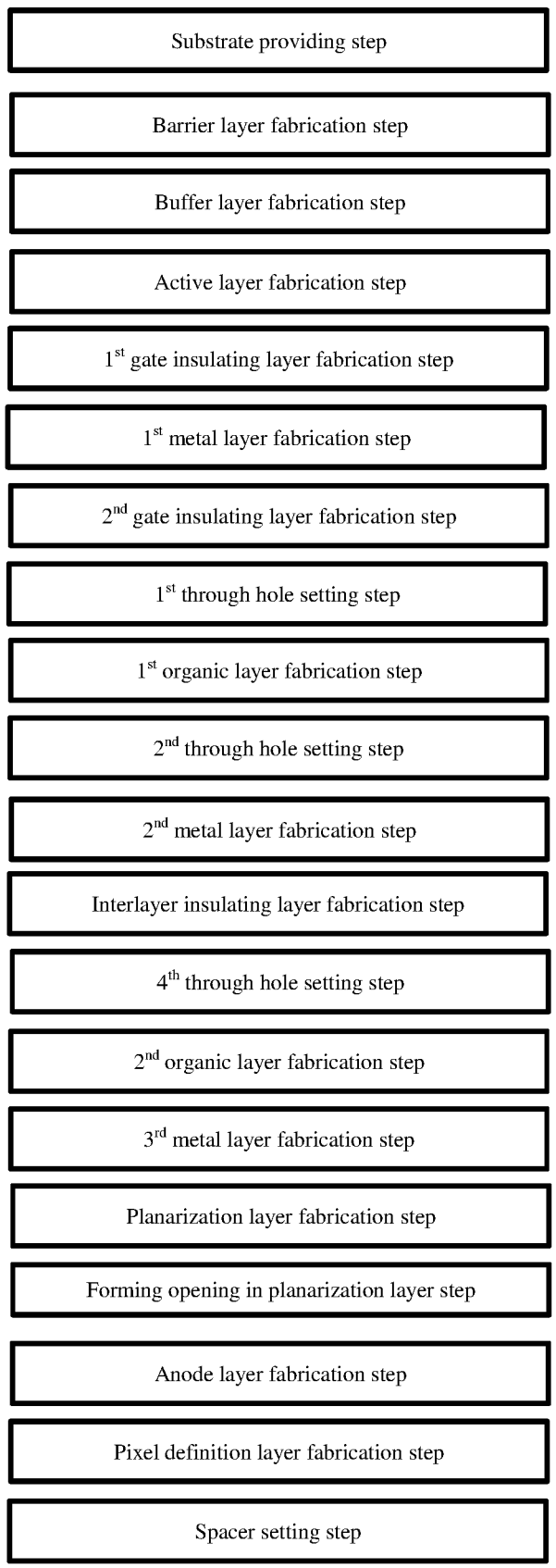
FIG. 3 is a flowchart of a fabrication method of a display panel according to an embodiment of the present invention.

As shown in FIG. 3, the present invention further provides a fabrication method of a display panel 100, which comprises steps S1 to S20.

Substrate providing step S1: providing a substrate 101. The substrate 101 is a flexible substrate and has a function of blocking moisture and oxygen. The substrate 101 can have better impact resistance and can effectively protect the display panel 100.

Barrier layer fabrication step S2: fabricating a barrier layer 102 on the upper surface of the substrate 101, and the barrier layer 102 blocks moisture and oxygen.

Buffer layer fabrication step S3: fabricating a buffer layer 103 on the upper surface of the barrier layer 102, and the buffer layer 103 functions as a buffer. A material of the buffer layer 103 can be a single layer of silicon dioxide (SiO2) or silicon nitride (SiNx), or a multilayer stack of silicon dioxide SiO2 and silicon nitride SiNx, and the silicon dioxide SiO2 film layer is provided on the top layer.

Active layer fabrication step S4: fabricating an active layer 104 on an upper surface of the buffer layer 103.

First gate insulating layer fabrication step S5: fabricating a first gate insulating layer 105 on an upper surface of the active layer 104 and the buffer layer 103. It may be deposited by a vapor deposition method, and a first gate insulating layer 105 is formed after curing to prevent short circuiting between metal lines.

First metal layer fabrication step S6: fabricating a first metal layer 106 on an upper surface of the first gate insulating layer 106.

Second gate insulating layer fabrication step S7: fabricating a second gate insulating layer 107 on the upper surfaces of the first gate insulating layer 105 and the first metal layer 106. An insulating material can be deposited by a vapor deposition method and formed after curing. The second gate insulating layer 107 prevents short circuiting between metal lines.

First through hole setting step S8: setting a first through hole 121 by a mask, and the first through hole 121 penetrates the barrier layer 102, the buffer layer 103, the first gate insulating layer 105, and the second gate insulating layer 107.

First organic layer fabrication step S9: fabricating a first organic layer 109 on an upper surface of the second gate insulating layer 107, and a material of the first organic layer 109 is an organic insulating material, which can prevent short circuiting between metal layers.

Second through hole setting step S10: setting a second through hole 122 on the first organic layer 109. The second through hole 122 is etched at the first organic layer 109 above the first metal layer 106 to provide a channel for subsequent metal layers.

Second metal layer fabrication step S11: exposing the first organic layer 109, forming a second metal layer 108 on the bottom and inner side walls of the first through hole 121 and on the upper surface of the second gate insulating layer 107. The second metal layer 108 is formed on the upper surface of the first organic layer 109.

Interlayer insulating layer fabrication step S12: the interlayer insulating layer 110 is fabricated on the upper surfaces of the first organic layer 109 and the second metal layer 108.

Fourth through hole setting step S13: setting the fourth through hole 123 on the interlayer insulating layer 110 so that the fourth through hole 123 penetrates the interlayer insulating layer 110 and is disposed opposite to the first through hole 121.

Second organic layer fabrication step S14: fabricating the second organic layer 112 in the fourth through hole 123.

Third metal layer fabrication step S15: fabricating a third metal layer 111 on the upper surfaces of the interlayer insulating layer 110 and the second organic layer 112.

Planarization layer fabrication step S16: fabricating the planarization layer 113 on the upper surfaces of the interlayer insulating layer 110 and the third metal layer 111.

Forming an opening in the planarization layer step S17: forming an opening of the planarization layer 113 by using a photomask to form through holes on the planarization layer 113 to provide a channel for the subsequent anode layer.

Anode layer fabrication step S18: fabricating an anode layer 114 on the upper surface of the planarization layer 113 and in the through hole of the planarization layer 113 so that the anode layer 114 is electrically connected to the third metal layer 111, and a fifth metal layer (not shown) can be disposed on the anode layer 114. The fifth metal layer (not shown) is used to transfer an initialization voltage signal and provide the initialization voltage signal to the entire display panel 100.

Pixel definition layer fabrication step S19: fabricating the pixel definition layer 115 on the upper surfaces of the planarization layer 113 and the anode layer 114, and the pixel definition layer 115 can be used to define the size of the light-emitting layer.

Spacer setting step S20: setting a spacer 117 above the pixel definition layer 115.

In the metal layer fabrication steps (the first metal layer fabrication step, the second metal layer fabrication step, and the third metal layer fabrication step), the deposited metal material is preferably aluminum or an aluminum alloy, and the aluminum or aluminum alloy improves the electrical conductivity of the metal layer and its bending characteristic, and reduces the risk of fracture of the metal layer when it is bent.

After the pixel definition layer, the fabrication method of the display panel may further comprise a light-emitting layer fabrication step, a pixel electrode layer fabrication step, and the like, as they are all existing technologies and are not described herein.

The technical effect of the fabrication method of the display panel of the present embodiment is using a metal layer made of aluminum or aluminum alloy to improve a conductivity and bendability of a metal wiring. A data signal line in a bending area is directly disposed on an upper surface of a substrate so that the data signal line is closer to a neutral plane, and the risk of fracture when the data signal line is bent is reduced. A metal layer structure with a grid shape is utilized to form a structure bridged by source and drain electrodes with a gate layer to provide a double-layer power signal, which can reduce resistance of the metal wiring, thereby reducing a voltage drop of a display panel and improving brightness uniformity of the display panel.

In the above embodiments, the description of each embodiment has its own emphasis. For the parts that are not described in detail in an embodiment, refer to the detailed descriptions of other embodiments above, which will not be repeated here. In specific implementation, each of the above units or structures may be implemented as independent entities, or any combination may be implemented as the same or several entities. For the specific implementation of the above units or structures, refer to the foregoing method embodiments. For specific implementation of the foregoing operations, refer to the foregoing embodiments, and details are not described herein again.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, wherein the display panel is divided into a display area, a line switching area, and a bending area in a horizontal direction and comprises a substrate, a barrier layer, a buffer layer, an active layer, a first gate insulating layer, a first metal layer, and a second gate insulating layer sequentially formed from bottom to top, and the display panel further comprises:
    a first through hole sequentially penetrating the second gate insulating layer, the first gate insulating layer, the buffer layer, and the barrier layer in the bending area;
    a second metal layer partially disposed on a bottom and an inner sidewall of the first through hole and extending to a surface of the second gate insulating layer;
    a first organic layer disposed on a surface of the second gate insulating layer away from the first gate insulating layer and in the first through hole, wherein the second metal layer is partially disposed on a surface of the first organic layer away from the second gate insulating layer;
    an interlayer insulating layer disposed on the surface of the first organic layer away from the second gate insulating layer; and
    a third metal layer disposed on a surface of the interlayer insulating layer away from the first organic layer;
    wherein a portion of the third metal layer located in the display area penetrates the interlayer insulating layer and is electrically connected to the second metal layer.

2. The display panel according to claim 1, wherein
    the first metal layer comprises aluminum or an aluminum alloy; and/or,
    the second metal layer comprises aluminum or aluminum alloy.

3. The display panel according to claim 1, further comprising:
    a second through hole penetrating the first organic layer in the display area,
    wherein the second metal layer is partially disposed in the second through hole and is disposed on the surface of the second gate insulating layer away from the first gate insulating layer.

4. The display panel according to claim 1, further comprising
    a third through hole penetrating the interlayer insulating layer, the first organic layer, the second gate insulating layer, and the first gate insulating layer; and/or,
    a third through hole, penetrating the interlayer insulating layer and the first organic layer; and/or,
    a third through hole penetrating the interlayer insulating layer.

5. The display panel according to claim 4, wherein the third metal layer is partially disposed in the third through hole.

6. The display panel according to claim 4, wherein the third metal layer is partially overlapped to a grid trace of the second metal layer through the third through hole to form a parallelly-connected circuit.

7. A display device, comprising the display panel according to claim 1.

* * * * *